(12) United States Patent
Frey

(10) Patent No.: US 6,424,580 B1
(45) Date of Patent: Jul. 23, 2002

(54) MEMORY WITH AN OPTIMIZED SETTING OF PRECHARGE TIMES

(75) Inventor: Christophe Frey, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/556,044

(22) Filed: Apr. 21, 2000

(30) Foreign Application Priority Data

Apr. 23, 1999 (FR) .............................................. 99 05328

(51) Int. Cl.$^7$ ................................................. G11C 7/00
(52) U.S. Cl. ................... 365/194; 365/191; 365/230.02
(58) Field of Search ................................. 365/194, 191, 365/201, 203, 230.02, 233

(56) References Cited

U.S. PATENT DOCUMENTS

| | | | |
|---|---|---|---|
| 4,813,021 A | | 3/1989 | Kai et al. |
| 5,742,557 A | * | 4/1998 | Gibbins et al. ........ 365/230.05 |
| 5,896,330 A | * | 4/1999 | Gibson ........................ 365/201 |
| 6,108,252 A | * | 8/2000 | Park ............................ 365/201 |

OTHER PUBLICATIONS

French Search Report dated Jan. 27, 2000 with Annex to French Application No. 99–05328.

* cited by examiner

*Primary Examiner*—David Nelms
*Assistant Examiner*—Thong Le
(74) *Attorney, Agent, or Firm*—Theodore E. Galanthay; Jose Gutman; Fleit, Kain, Gibbons, Gutman & Bongini, P.L.

(57) ABSTRACT

An integrated circuit includes an array of memory cells that are selected by rows and read by columns. The columns are first precharged by an internal signal to then read the memory cells. The read is responsive to an edge of a clock signal and the read is of an unknown delay. A multiplexer output provides the internal signal. The multiplexer includes a plurality of inputs electrically connected to delay lines of different delay sizes that receive the edge of the clock signal. A multiplexer control circuit selects a delay line to provide the internal signal as soon as possible after the unknown delay.

17 Claims, 4 Drawing Sheets

MEMORY WITH AN OPTIMIZED SETTING OF PRECHARGE TIMES

CROSS-REFERENCE TO RELATED APPLICATIONS

This application is based upon and claims priority from prior French Patent Application No. 99-05328, filed Apr. 23, 1999, the entire disclosure of which is herein incorporated by reference.

BACKGROUND OF THE INVENTION

1. Field of the Invention

The present invention generally relates to memory devices, and more specifically to a method for optimizing memory read cycles of memory devices.

2. Description of Related Art

Generally, a read operation on a memory provides data on bit lines at an unknown time after a read control signal. The bit lines must be precharged before each read operation and, when two readings are performed in a row, the precharge necessary for the second reading must be started after the end of the first reading, that is, at an unknown time after the signal controlling the first reading.

FIG. 1 schematically shows a memory 1 formed of memory cells 2 arranged in rows and columns. The cells of each row are selected by a respective row line 3, and the cells of each column are accessible in the read mode by a respective pair of complementary bit lines 4. Each pair of bit lines 4 is associated with a respective read amplifier 5 and each bit line is connected to a supply line Vdd via a precharge transistor 6. Row lines 3 are connected to a decoder 7 that receives an address A via a latch 8 rated by a read control clock signal CK. Precharge transistors 6 are controlled by a same precharge signal P. Read amplifiers 5 generate an output signal O.

To perform a reading, transistors 6 are first turned on for a duration sufficient to precharge complementary bit lines 4 to voltage Vdd, then transistors 6 are turned off and a row line 3 is activated by decoder 7. Each pair of bit lines is then unbalanced according to the information stored in the cell of the selected row. When two read operations are performed in a row, the precharge that must come before the second reading deletes the data generated by the first reading. Thus, it is necessary to guarantee that the precharge for a current read operation is always performed after the end of the preceding read operation.

The function of a reference column 9 will be described hereafter. FIG. 2 shows a memory of the type in FIG. 1, the precharge control signal P of which is obtained by inverting clock CK that rates the read operations.

FIG. 3 illustrates read operations on the circuit of FIG. 2. At a time t0, address A provided to memory 1 changes. At a time t1 that corresponds to the next rising edge of clock signal CK, address A is provided to decoder 7 by latch 8. From time t1 on, corresponding to the beginning of a read operation, output O of the memory starts changing and its state is undetermined (X). Output O is assumed to remain in an undetermined state for an unknown duration $\Delta$ that corresponds to the response time of the slowest column of memory 1.

At a time t2, at the end of duration $\Delta$, output O is assumed to be stable and it can be used. From a time t3 on, corresponding to the next rising edge of control signal P, the precharge necessary to the next read operation starts. Output O is undetermined during the entire precharge interval, which here lasts until the next rising edge of clock signal CK. It should be noted that output O generated in a read cycle starting at time t1 is stable and useable only between times t2 and t3. Time t2 depends on maximum read duration $\Delta$, which is a characteristic of memory 1. Time t3 depends on duration t3−t1, that is, on the duty cycle of signal CK.

FIG. 3 shows a signal CK with a duty cycle of one half, but it should be noted that if the latter decreases, duration t3−t1 also decreases and may even become smaller than duration $\Delta$, in which case output O is deleted before being readable. Thus, in the case where precharge signal P is the complement of clock signal CK, a minimum value of the duty cycle of signal CK has to be guaranteed, which is not always possible. It has thus been sought to generate a precharge control signal P independent from the duty cycle of clock signal CK.

FIG. 4 shows a memory 1 of the type in FIG. 1, the precharge control signal P of which is obtained by delaying clock signal CK with a delay line D. FIG. 5 illustrates successive read operation on the circuit of FIG. 4. $t_D$ designates the delay introduced by delay line D: precharge control signal P is activated at a time t4 occurring at a duration $t_D$ after time t1. Output O generated in a read cycle that starts at a time t1 is useable between above-mentioned time t2, which depends on duration $\Delta$, and time t4, which depends on duration $t_D$ of delay line D. The duty cycle of clock signal CK has no influence upon duration t4−t2. However, duration $\Delta$ and delay $t_D$ vary according to the manufacturing method used, to temperature, as well as to other parameters. It is difficult to know these variations in advance, and a delay $t_D$ greater than necessary is chosen, to guarantee that duration t4−t2 will always be sufficient to use output O.

Delay $t_D$ must however remain smaller than one period of signal CK, so that the precharge can occur during the read cycle. Thus, if delay $t_D$ is too long, the maximum operating frequency, and thus, the performances of memory 1, have to be limited. It has thus been sought to provide a precharge control signal P with a delay that depends on the features of the memory. For this purpose, in FIG. 1, a reference column 9, of same structure as a normal column and arranged at the distal end of precharge and row lines 3, has been provided. With this configuration, reference column 9 is the latest one to provide a stable output $O_1$ during a read operation.

FIG. 6 shows a memory of this type, the precharge control signal P of which is generated based on output $O_1$ of the reference column by an edge detector 11. FIG. 7 illustrates read operations on the circuits of FIG. 6. Signal $O_1$ is generated at a time t5, responsive to the edge of signal CK of time t1. $\Delta_1$ designates the duration elapsed between times t1 and t5. For the previously discussed reasons, duration $\Delta_1$ is always greater than duration $\Delta$, whatever the features and operating conditions of memory 1.

Edge detector 11 generates precharge control signal P responsive to signal $O_1$ at a time t6. $\Delta_2$ designates the duration between times t5 and t6. It mainly depends on the propagation time of signal $O_1$ and on precharge control signal P. Duration $\Delta_2$ is relatively long, since the terminal that generates signal $O_1$ is far from the input terminals, especially from that on which precharge control signal P is provided. Durations $\Delta_1$ and $\Delta_2$, which correspond to the memory width, increase with the size thereof. Now, the sum of durations $\Delta_1$ and $\Delta_2$ must remain smaller than one period of signal CK so that the precharge occurs in the read cycle. Thus, the larger a memory, the longer duration $\Delta_1+\Delta_2$, and the longer the period of signal CK has to be chosen, which limits the memory performances.

Thus, there is a need to overcome the disadvantages of the prior art as discussed above, and particularly to handle the problem of unknown delays during memory read cycles.

SUMMARY OF THE INVENTION

In view of these drawbacks, in accordance with an aspect the present invention it is intended to overcome the above-mentioned drawbacks and to provide, based on a clock signal, a precharge control signal that enables optimizing the memory reading rate.

A preferred embodiment of the present invention provides an integrated circuit generating an event responsive to an edge of an input signal and with an unknown delay, which includes means for providing an internal signal including several delay lines of different sizes that receive the edge of the input signal, a multiplexer, each input of which receives the output of one of the delay lines and the output of which generates the internal signal, and a multiplexer control circuit for selecting a delay line to provide the internal signal as soon as possible after the unknown delay.

According to an alternative preferred embodiment of the present invention, the integrated circuit includes at least one reference element that generates at least one reference edge responsive to the edge of the input signal with a delay greater than the unknown delay, and the control circuit includes several comparators each receiving on a first input the output of a respective delay line and on a second input the at least one reference edge, and a circuit for analyzing the comparator outputs that controls the multiplexer to change the delay line selected during the test when the outputs of the comparators indicate a variation of the duration between the output of the selected delay line and the at least one reference edge.

According to a further alternative preferred embodiment of the present invention, the integrated circuit includes an array of memory cells selected by rows by an address signal and accessible in the read mode by columns by bit lines, the input signal is a clock signal for synchronizing the address signal, the event is the reading of a column, and the internal signal is a signal of precharge of the bit lines.

According to an additional preferred embodiment of the present invention, the integrated circuit includes an array of memory cells selected by rows by an address signal and accessible in the read mode by columns by bit lines, the input signal is a clock signal for synchronizing the address signal, the event is the reading of a column, the internal signal is a signal of precharge of the bit lines, and the at least one reference element is an additional column located with respect to the other columns so that its reading is slower than the reading of the other columns.

Further, the present invention also provides a method of setting the above-mentioned circuit, including the steps of, in a test mode:

a) selecting the shortest delay line, b) providing the circuit with a predetermined input signal, c) if the internal signal generated by the multiplexer occurs after the event generated responsive to the edge of the input signal, leaving the test mode, d) otherwise selecting the immediately longer delay line and repeating steps b) and c).

Other features and advantages of the preferred embodiments of the present invention will become apparent from the following detailed description. It should be understood, however, that the detailed description and specific examples, while indicating preferred embodiments of the present invention, are given by way of illustration only and various modifications may naturally be performed without deviating from the spirit of the present invention.

DETAILED DESCRIPTION OF THE PREFERRED EMBODIMENTS

Preferred embodiments of the present invention will be described in detail hereinbelow with reference to the attached drawings.

Figure 1:
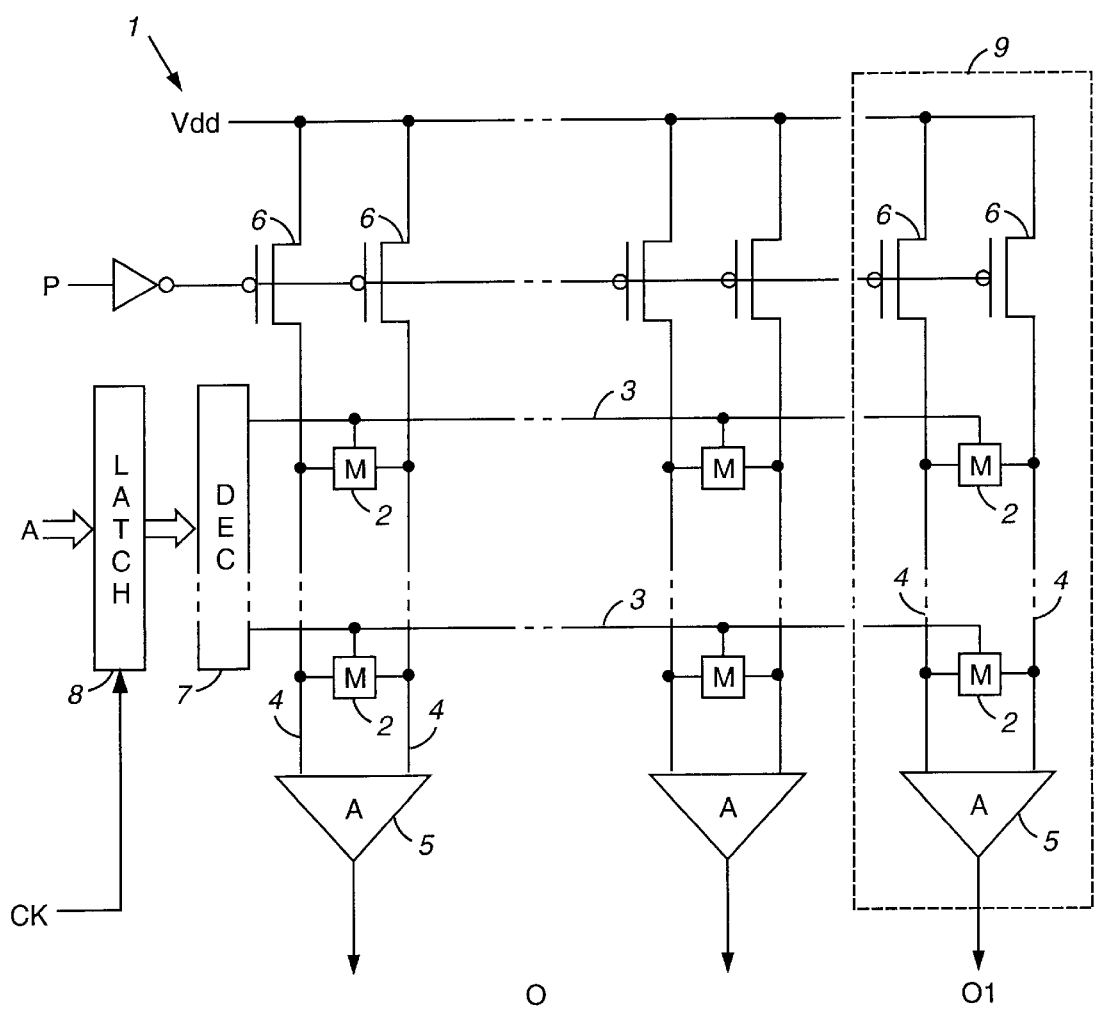
FIG. 1, previously described, schematically and partially shows a RAM structure.
Figure 2:
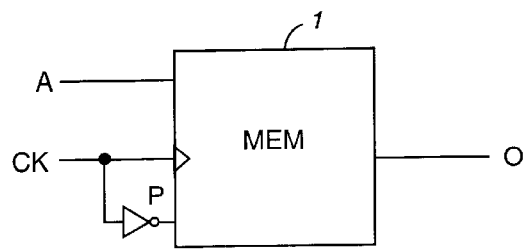
FIG. 2, previously described, illustrates a memory with a first conventional mode of generation of a precharge control signal.
Figure 3:
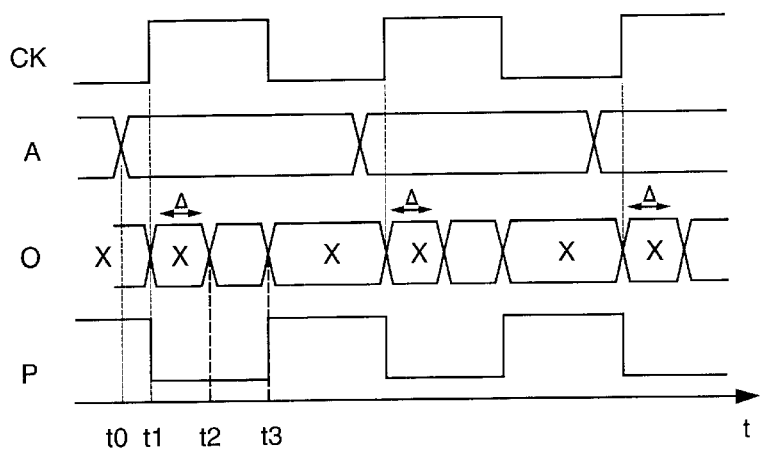
FIG. 3, previously described, illustrates the operation of the circuit of FIG. 2.
Figure 4:
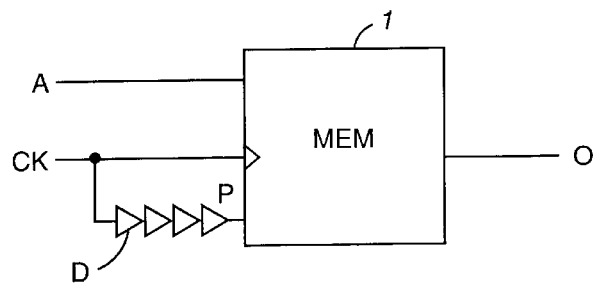
FIG. 4, previously described, illustrates a memory with a second conventional mode of generation of a precharge control signal.
Figure 5:
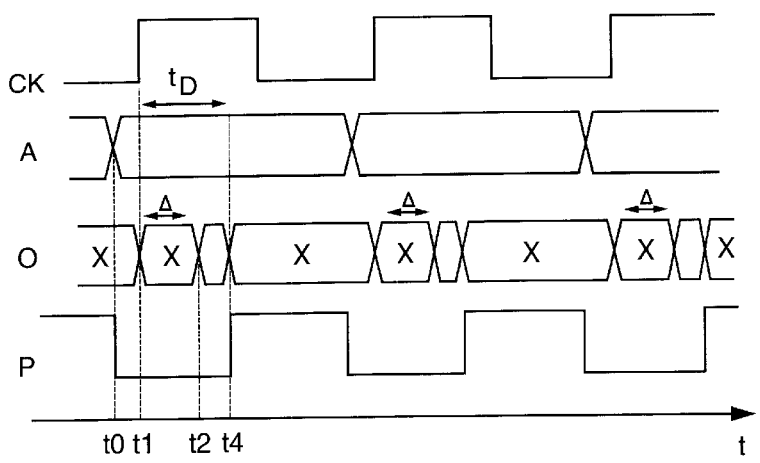
FIG. 5, previously described, illustrates the operation of the circuit of FIG. 4.
Figure 6:
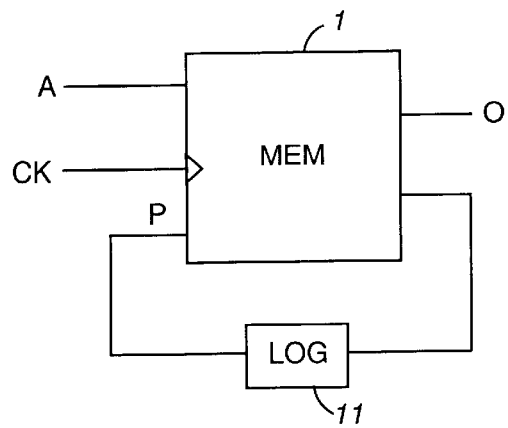
FIG. 6, previously described, illustrates a memory with a third conventional mode of generation of a precharge control signal.
Figure 7:
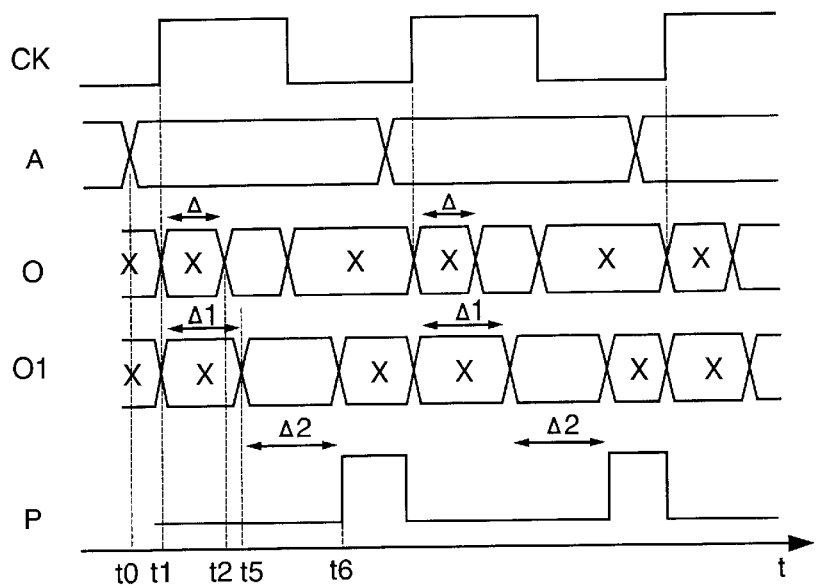
FIG. 7, previously described, illustrates the operation of the circuit of FIG. 6.
Figure 8:
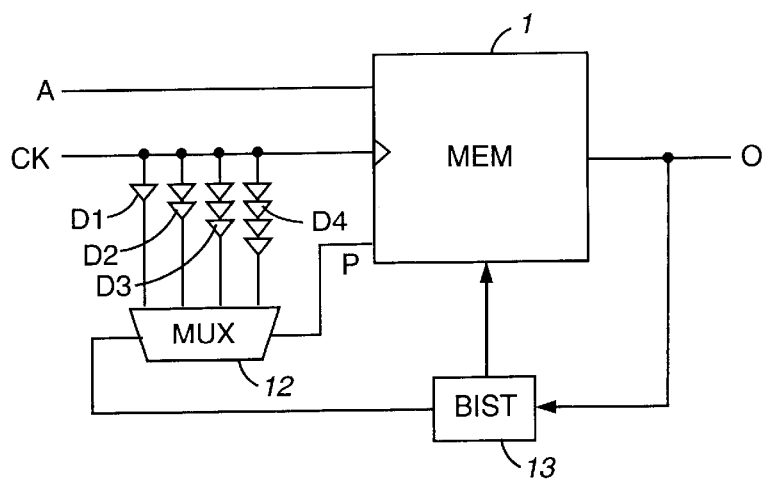
FIG. 8 illustrates a memory with a mode of generation of a precharge control signal according to the present invention.

A preferred embodiment of the present invention consists of generating by means of several delay lines, each receiving clock signal CK, several internal signals, then selecting that of the internal signals that is most appropriate to be used as a precharge control signal. FIG. 8 shows a memory 1 similar to that in FIG. 1, which receives an address A and a clock signal CK. Clock signal CK is provided to four delay lines $D_1$ to $D_4$ of different sizes, the outputs of which are connected to the inputs of a multiplexer 12. The output of multiplexer 12 forms precharge control signal P, and the multiplexer is controlled by an integrated self-test circuit (BIST) 13. Circuit 13 is provided to perform conventional tests on memory 1, by writing therein test patterns and by checking whether the memory outputs correspond to the test patterns.

Figure 9:
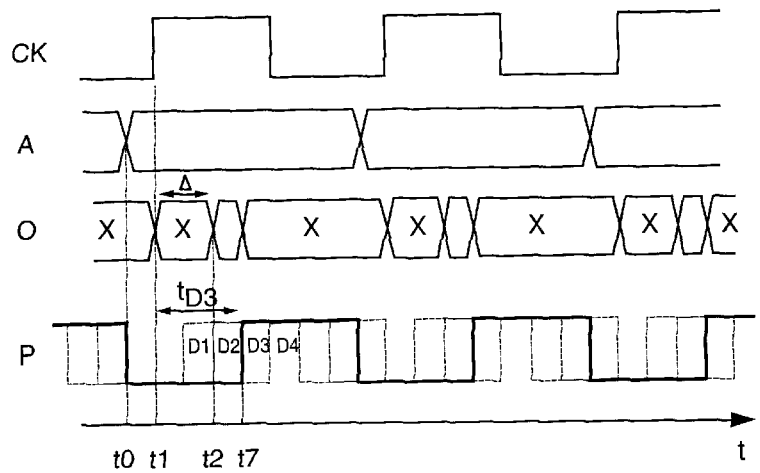
FIG. 9 illustrates the operation of the circuit of FIG. 8.

During a test, for example, upon power-on, circuit 13 initially selects the shortest delay line $D_1$. It then performs a conventional test operation and checks whether the data generated by the memory are correct. If they are, the delay introduced by the current delay line is sufficient and this delay line is selected to generate precharge control signal P in normal mode. If they are not correct, the errors are probably due to the fact that the precharge control signal is generated too soon, before the data O provided by the memory have stabilized. Circuit 13 then selects the immediately longer delay line and repeats the preceding test steps, and so on until selection of a delay line that generates no error. FIG. 9 illustrates the operation in normal mode of the circuit of FIG. 8, for which the test has enabled selecting delay line $D_3$. Precharge control signal P generated responsive to the edge of clock signal CK of time t1 occurs at a time t7, the duration separating times t1 and t7 being equal to time $t_{D3}$ necessary to cross delay line $D_3$ and multiplexer 12.

The shapes of precharge control signal P corresponding to delay lines $D_1$, $D_2$, $D_4$ have been shown in dotted lines. The precharge control signals P that would be generated by delay lines $D_1$ and $D_2$ would arrive too early and would not enable properly reading data O. Conversely, the precharge control signal that would be generated by delay line $D_4$ would arrive sufficiently late after the stabilizing of data O, but would impose a significant delay between the stabilizing of data O and the beginning of the next precharge, which would uselessly limit the read frequency of memory 1.

It may occur, for example, after a temperature change, that the speed of a memory circuit varies along its operation. It may then be necessary to change the delay line to maintain an optimal operation. The embodiment of FIG. 8 only enables performing a delay line selection at the end of a test that includes several writings and readings that disturb the data written in the memory. Thus, it is not possible, with this embodiment, to select a new delay line in operation.

Figure 10:
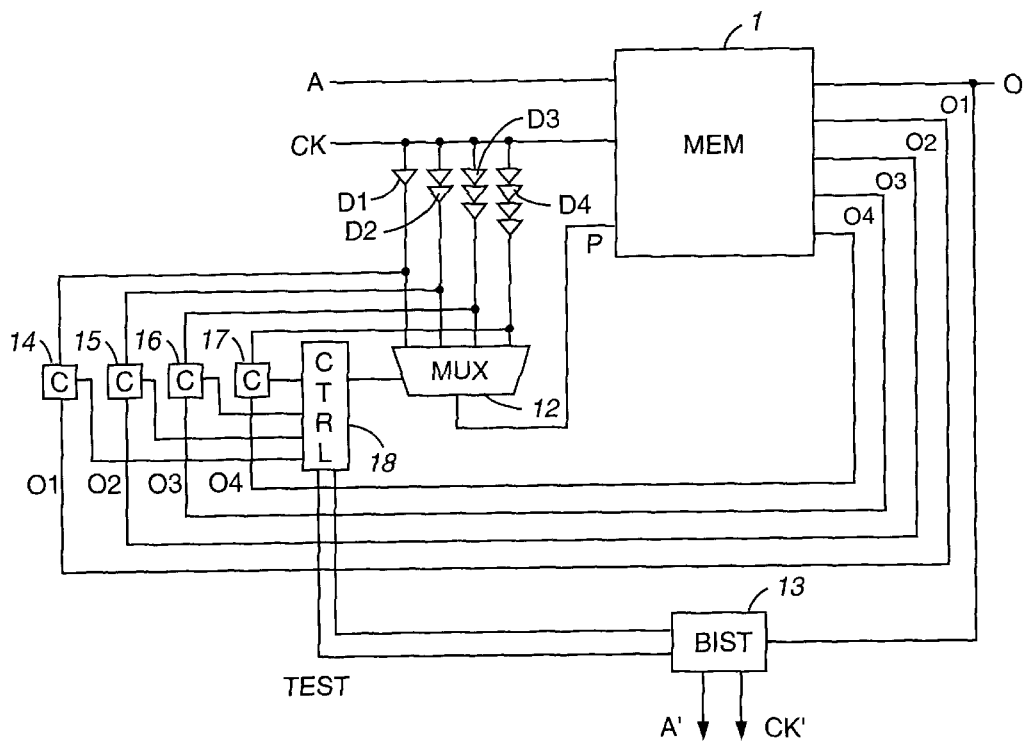
FIG. 10 illustrates a memory with an alternative of the precharge control signal generation mode according to the present invention.

FIG. 10 shows an alternative embodiment of the circuit of FIG. 8, that enables changing the selection of the delay line in operation. Memory 1 is of the type described in relation with FIG. 1, and it is provided with four reference elements 9 at the end of the memory, generating respective reference signals O1, O2, O3, and O4. Four comparators 14 to 17 respectively receive the outputs of delay lines $D_1$ to $D_4$, and reference signals O1 to O4. The outputs of these comparators are provided to a control circuit 18 that also receives the output of a test circuit 13 and that controls multiplexer 12. The circuit of FIG. 10 is provided for, upon power-on, selecting the delay line that best suits in the way described in relation with FIG. 8.

In normal operation, control circuit 18 analyzes the duration included between the rising edge and the falling edge of the comparison result for the selected delay line. If the duration included between these edges does not vary, this means that the duration of crossing the selected delay line and the duration of generation of the reference signal have not changed, or that both durations have changed in the same proportions. In both cases, the selected delay line still is the right one and control circuit 18 remains inactive.

If the duration between these edges varies, this means that the duration of crossing the selected delay line changes with respect to the duration of generation of the reference signal. If the variation is of a duration longer than the chosen pitch for the delay lines, this means that the selected delay line must be replaced with a longer or shorter delay line, according to whether the duration of crossing the selected delay line has increased or decreased with respect to the duration of generation of the reference signal. Circuit 18 accordingly controls multiplexer 12.

Of course, the present invention is likely to have various alterations, modifications, and improvements which will readily occur to those skilled in the art. As an example in the embodiment described in relation with FIG. 10, four reference columns 9 are used to provide four identical reference signals to amplifiers 14 to 17. Thus, the read amplifier 5 of each of the reference columns provides a signal to a single comparator input having a moderate capacitance, which enables a fast operation. According to an alternative, a single reference column provided with a high fan-out read amplifier, able to provide a reference signal to several comparators at the same time while keeping a high operating speed, may however be used.

Similarly, the number of four delay lines is taken as an example, and those skilled in the art will easily adapt the present invention to a different number of delay lines. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit comprising:
    means for generating an event of an unknown delay, the event being responsive to an edge of an input signal;
    a plurality of delay lines of different sizes that receive an edge of the input signal;
    a multiplexer, each input of which receives the output of one of the delay lines and the output of which generates an internal signal; and
    a multiplexer control circuit for selecting a delay line to provide the internal signal as soon as possible after the unknown delay.

2. The integrated circuit of claim 1, further comprising an array of memory cells selected by rows by an address signal and accessible in a read mode by columns by bit lines, wherein
    the input signal is a clock signal for synchronizing the address signal;
    the event is the reading of a column; and
    the internal signal is a signal of precharge of the bit lines.

3. The integrateed circuit of claim 1, further comprising at least one reference element that generates at least one reference edge responsive to the edge of the input signal with a delay greater than the unknown delay, and wherein the multiplexer control circuit includes
    a plurality of comparators each receiving on a first input the output of a respective delay line and on a second input the at least one reference edge; and
    a circuit for analyzing the output of the plurality of comparators and that controls the multiplexer to change the delay line selected during the test when the outputs of the comparators indicate a variation of a duration between the output of the selected delay line and the at least one reference edge.

4. The integrated circuit of claim 3, further comprising an array of memory cells selected by rows by an address signal and accessible in the read mode by columns by bit lines, wherein the input signal is a clock signal for synchronizing the address signal;

the event is the reading of a column;

the internal signal is a signal of pregharge of the bit lines; and the at least one reference element is an additional column located with respect to the other columns so that its reading is slower than the reading of the other columns.

5. A method of selecting an internal signal in an integrated circuit, the method comprising the steps of:

a) selecting one of a plurality of delay lines, the selected one having the shortest delay;

b) providing the integrated circuit with a predetermined input signal;

c) providing an internal signal that is a function of the selected one of the plurality of delay lines;

d) generating an event of an unknown delay, the event being responsive to the edge of the input signal;

e) if the internal signal occurs after the event generated in response to the edge of the input signal, leaving the test mode; and f) otherwise selecting a different one of the plurality of delay lines, the selected different one having the next longer delay, and repeating steps b), c), d), and e).

6. A method of setting a delay of an internal signal in an integrated circuit, the method comprising the steps of:

a) selecting one of a plurality of delay lines of different delay sizes that receive an edge of a predetermined input signal, the selected one having the shortest delay;

b) providing a predetermined input signal to the integrated circuit;

c) providing an internal signal corresponding to the selected one of the plurality of delay lines; and d) if the provided internal signal occurs after an event generated responsive to the edge of a predetermined input signal, leaving a test mode.

7. The method according to claim 6, further comprising the step of:

e) if the event of step d) occurs before the provided internal signal, selecting the immediately longer delay line of the plurality of delay lines and repeating steps b), c), and d).

8. The method according to claim 6, wherein the predetermined input signal is a clock signal.

9. The method according to claim 6, wherein step c) comprises the step of:

controlling a multiplexer, where each input thereof receives the output of one of the plurality of delay lines, such that the output of the multiplexer provides the internal signal.

10. The method according to claim 6, wherein the internal signal is a signal of precharge of at least one bit line of an array of memory cells.

11. The method according to claim 10, wherein the array of memory cells is accessible to be read in response to the signal of precharge of at least one bit line of the array of memory cells.

12. The method according to claim 11, wherein the event comprises reading of at least one of the array of memory cells.

13. The method according to claim 6, wherein the integrated circuit is a memory device, and wherein the event is a read of at least one memory cell in the memory device.

14. An integrated circuit that stores selectably readable data, the integrated circuit comprising:

at least one memory cell that is selectable to read data stored therein, the read being of an unknown delay;

a plurality of delay lines of different sizes that receive an edge of an input signal;

a multiplexer including at least one input and one output, each of the at least one input being electrically coupled to the output of one of the plurality of delay lines, and the output of the multiplexer providing an internal signal to precharge at least one bit line corresponding to the at least one memory cell to make it accessible for a read of the data stored therein; and a multiplexer control circuit for selecting a delay line from the plurality of delay lines to provide the internal signal as soon as possible after the unknown delay.

15. The integrated circuit of claim 14, wherein the input signal is a clock signal.

16. The integrated circuit of claim 14, wherein the internal signal is electrically coupled to precharge at least one column of the at least one memory cell to make the at least one column accessible for reading of the data stored in the at least one memory cell.

17. The integrated circuit of claim 16, wherein the at least one memory cell is selectable for reading data stored therein by providing an address signal to at least one row of the at least one memory cell.

* * * * *